United States Patent
Zou et al.

(10) Patent No.: US 10,707,843 B2
(45) Date of Patent: Jul. 7, 2020

(54) RELAXATION OSCILLATOR

(71) Applicant: AmpliPHY Technologies Limited, Hangzhou (CN)

(72) Inventors: Hehong Zou, Hangzhou (CN); Yichao He, Hangzhou (CN); Qingping Li, Hangzhou (CN)

(73) Assignee: AMPLIPHY TECHNOLOGIES LIMITED, Hangzhou (CN)

( * ) Notice: Subject to any disclaimer, the term of this patent is extended or adjusted under 35 U.S.C. 154(b) by 0 days.

(21) Appl. No.: 16/246,575

(22) Filed: Jan. 14, 2019

(65) Prior Publication Data

US 2020/0091897 A1  Mar. 19, 2020

(30) Foreign Application Priority Data

Sep. 18, 2018  (CN) .......................... 2018 1 1086922

(51) Int. Cl.
*H03K 3/0231*  (2006.01)
(52) U.S. Cl.
CPC .................................. *H03K 3/0231* (2013.01)
(58) Field of Classification Search
CPC ........... H03K 3/0231; H03K 4/12; H03K 4/50
USPC .................................................. 331/111, 143
See application file for complete search history.

(56) References Cited

U.S. PATENT DOCUMENTS

| | | | | | |
|---|---|---|---|---|---|
| 5,699,024 | A | * | 12/1997 | Manlove | H03K 3/0231 331/111 |
| 6,020,792 | A | * | 2/2000 | Nolan | H03K 3/011 331/111 |
| 6,107,894 | A | * | 8/2000 | Van Tuijl | H03K 4/502 331/111 |
| 7,005,933 | B1 | * | 2/2006 | Shutt | G06F 1/04 331/111 |
| 7,034,627 | B1 | * | 4/2006 | Kudari | H03K 3/011 331/111 |
| 8,669,820 | B2 | * | 3/2014 | Abe | H03K 4/501 327/115 |
| 2006/0038625 | A1 | * | 2/2006 | Ricard | G11C 5/145 331/143 |
| 2007/0103243 | A1 | * | 5/2007 | Gong | H03K 3/0231 331/111 |
| 2009/0108948 | A1 | * | 4/2009 | Kim | H03K 3/0231 331/143 |

(Continued)

*Primary Examiner* — Levi Gannon
(74) *Attorney, Agent, or Firm* — Bayramoglu Law Offices LLC

(57) ABSTRACT

This invention provides a relaxation oscillator, including a first comparator, a second comparator, an SR latch, and a capacitor control module. Input ends of the two comparators are coupled with the capacitor control module and an external reference threshold voltage, and two output ends are coupled with the input ends of the SR latch; output ends of the SR latch are coupled with input ends of the capacitor control module; According to the external reference threshold voltage, a first comparison signal generated by the first comparator and a second comparison signal generated by the second comparator are inputted into the SR latch to generate a control signal. According to a bias current of the external bias current source and the control signal outputted by the SR latch, periodic charging and discharging of a first capacitor and a second capacitor are controlled to generate oscillating signals.

7 Claims, 2 Drawing Sheets

(56) References Cited

U.S. PATENT DOCUMENTS

| | | | | |
|---|---|---|---|---|
| 2012/0126906 A1* | 5/2012 | Choe | ............... | H03K 4/502 |
| | | | | 331/143 |
| 2012/0194279 A1* | 8/2012 | Nonis | ............... | H03K 4/501 |
| | | | | 331/34 |
| 2013/0038364 A1* | 2/2013 | Tokairin | ............... | H03K 4/502 |
| | | | | 327/156 |
| 2014/0028408 A1* | 1/2014 | Wang | ............... | H03K 3/02315 |
| | | | | 331/144 |

* cited by examiner

RELAXATION OSCILLATOR

CROSS-REFERENCE TO RELATED APPLICATIONS

This Non-provisional application claims priority under 35 U.S.C. § 119(a) on Patent Application No(s). 201811086922.3 filed in People's Republic of China on Sep. 18, 2018, the entire contents of which are hereby incorporated by reference.

BACKGROUND OF THE INVENTION

Field of the Invention

This invention relates to a technical field of an oscillator and, more particularly, to a relaxation oscillator.

Description of the Related Art

The relaxation oscillator is a nonlinear electronic oscillator circuit which produces a triangular or square wave repeated output signals. This circuit includes a feedback loop, usually consisting of a switching device, a transistor, a comparator, a relay, an operational amplifier, and an active device such as an inductor or a capacitor.

Through a current, the capacitor is repeatedly charged until it reaches a threshold level and then discharges again. The period of the oscillator depends on a time constant of this capacitor circuit. The capacitor suddenly switches between charging and discharging modes, so as to generate repeated waveforms that vary discontinuously. This solution is usually used to generate low frequency signals. If high-frequency signals are to be generated, we need a relative small capacitor or a relative large current. However, the relative small capacitor will result in a relative large deviation between the actual frequency and the theoretical frequency, while the current power consumption of the actual chip will increase if the current is increased.

BRIEF SUMMARY OF THE INVENTION

This invention provides a relaxation oscillator to solve the above-mentioned problem.

To solve the above-mentioned problem, an embodiment of this invention provides a relaxation oscillator including:
a first comparator, including a first input end, a second input end, and an output end, the first input end thereof being coupled with a first output end of a capacitor control module, the second input end thereof being coupled with an external reference threshold voltage, and the output end thereof being coupled with a first input end of an SR latch;
a second comparator, including a first input end, a second input end, and an output end, the first input end thereof being coupled with a second output end of the capacitor control module, the second input end thereof being coupled with the external reference threshold voltage, and the output end thereof being coupled with a second input end of the SR latch;
the SR latch, including the first input end, the second input end, a first output end, and a second output end, the first output end thereof being coupled with a first input end of the capacitor control module, and the second output end thereof being coupled with a second input end of the capacitor control module; and
the capacitor control module, including the first input end, the second input end, a bias current input end, the first output end, the second output end, a first capacitor, and a second capacitor, and the bias current input end thereof being coupled with an external bias current source; and
wherein according to the external reference threshold voltage, a first comparison signal generated by the first comparator and a second comparison signal generated by the second comparator are inputted into the SR latch to generate a control signal, and according to a bias current of the external bias current source and the control signal outputted by the SR latch, periodic charging and discharging of the first capacitor and the second capacitor are controlled to generate oscillating signals.

As an implementing way, the capacitor control module may include:
a first current mirror unit, coupled with a bias current input end and configured to mirror the bias current of the bias current source;
a second current mirror unit, coupled with the first current mirror unit and configured to mirror the bias current again after the bias current is mirrored by the first current mirror unit; and
an oscillating unit coupled with an output end of the second current mirror unit, the first input end of the capacitor control module, the second input end of the capacitor control module, the first output end of the capacitor control module, and the second output end of the capacitor control module, and the oscillating unit configured to receive the bias current after the bias current is mirrored by the second current mirror unit, wherein at the same time, the first capacitor may be controlled to periodically charge or discharge through a first control signal received by the first input end of the capacitor control module, the second capacitor may be controlled to periodically charge or discharge through a second control signal received by the second input end of the capacitor control module, the first output end of the capacitor control module may output the oscillating signal generated by the first capacitor, and the second output end of the capacitor control module may output the oscillating signal generated by the second capacitor.

As an implementing way, the first current mirror unit may adopt a current mirror unit in a cascode structure consisting of n-channel metal oxide semiconductor transistors.

As an implementing way, the second current mirror unit may adopt a current mirror unit in a cascode structure consisting of positive channel metal oxide semiconductor (PMOS) transistors.

As an implementing way, the oscillating unit may include:
a first oscillating circuit including a ninth PMOS transistor, a tenth NMOS transistor, and the first capacitor, a gate of the ninth PMOS transistor being coupled with a first input end of the oscillating unit, a source of the ninth PMOS transistor being coupled with the output end of the second current mirror unit, a drain of the ninth PMOS transistor being coupled with a drain of the tenth NMOS transistor, a gate of the tenth NMOS transistor being coupled with the first input end of the oscillating unit, a source of the tenth NMOS transistor being grounded, one end of the first capacitor being coupled with a connection node of the drain of the ninth PMOS transistor and the drain of the tenth PMOS transistor, the other end of the first capacitor being grounded, and the first output end of the capacitor control module being coupled with the connection node of the drain of the ninth PMOS transistor and the drain of the tenth PMOS transistor; and
a second oscillating circuit including an eleventh PMOS transistor, a twelfth NMOS transistor, and the second capacitor, a gate of the eleventh PMOS transistor being coupled with a second input end of the oscillating unit, a source of the eleventh PMOS transistor being coupled with the output end of the second current mirror unit, a drain of the eleventh PMOS transistor being coupled with a drain of the twelfth NMOS transistor, a gate of the twelfth NMOS transistor being coupled with the second input end of the oscillating unit, a source of the twelfth NMOS transistor being grounded, one end of the second capacitor being coupled with a connection node of the drain of the eleventh PMOS transistor and the drain of the twelfth NMOS transistor, the other end of the second capacitor being grounded, and the second output end being coupled with the connection node of the drain of the eleventh PMOS transistor and the drain of the twelfth NMOS transistor.

As an implementing way, both the first comparator and the second comparator may include:

a first current mirror unit, coupled with the external bias current source and configured to mirror the bias current of the bias current source;

a second current mirror unit, coupled with the first current mirror unit and configured to mirror the bias current again after the bias current is mirrored by the first current mirror unit;

a comparator signal channel coupled with the second current mirror unit, the first input end of the comparator, and the second input end of the comparator, and the comparator signal channel configured to receive the bias current after the bias current is mirrored by the second current mirror unit, a feedback signal of the capacitor control unit, and the external reference threshold voltage and generate a comparison signal according to the bias current which has already been mirrored by the second current mirror unit, the feedback signal of the capacitor control unit, and the external reference threshold voltage;

a third current mirror unit, coupled with the comparator signal channel and configured to convert the comparison signal outputted by the comparator signal channel into a signal capable of being inputted into a reverse unit at a single-end; and the reverse unit, coupled with the third current mirror unit and configured to amplify the comparison signal after the comparison signal is converted by the third current mirror unit and output the amplified comparison signal to the SR latch.

As an implementing way, the first current mirror unit may adopt a current mirror unit in a cascode structure consisting of NMOS transistors.

As an implementing way, the third current mirror unit may adopt an active inductor current mirror unit.

Compared with the prior art, beneficial effects of this invention are as follows. According to the external reference threshold voltage, the first comparison signal generated by the first comparator and the second comparison signal generated by the second comparator are inputted into the SR latch to generate the control signal. According to the bias current of the external bias current source and the control signal outputted by the SR latch, periodic charging and discharging of the first capacitor and the second capacitor are controlled to generate oscillating signals. Through structural optimization of the capacitor module, oscillating output can be obtained by only using a single-circuit bias current; due to the external reference voltage and current source and the relation between two capacitors, the frequency is stable, and the frequency does not change with a power supply voltage. Moreover, the power consumption of this relaxation oscillator circuit is reduced, the required total current is reduced, and the comparator has a relative fast speed which can quickly respond to the comparison signal beyond the threshold, such that the frequency is more accurate.

Figure 1:
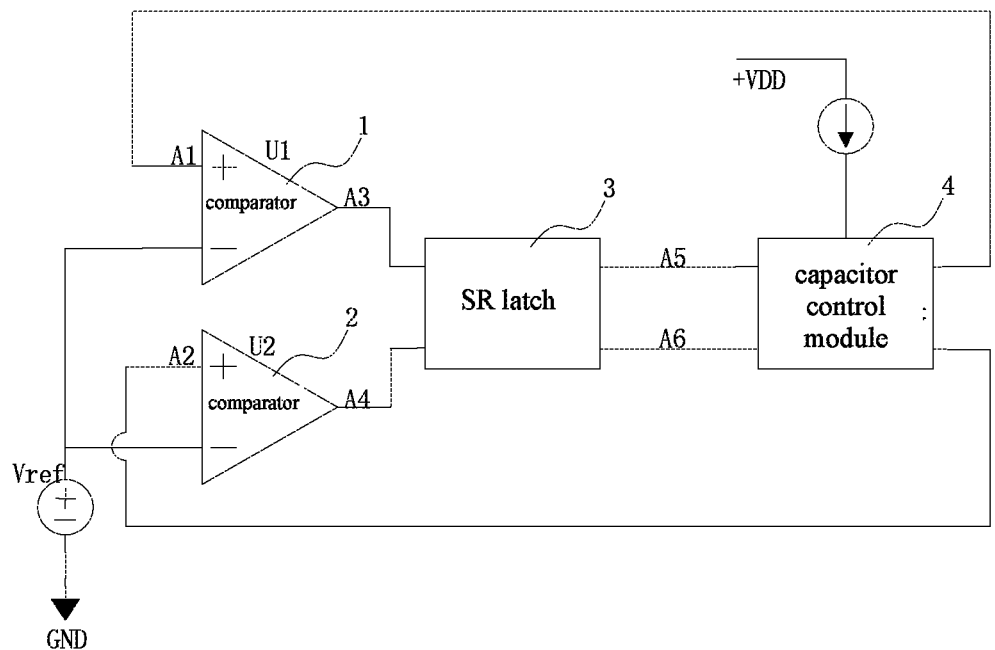
FIG. 1 is a system flow chart of a relaxation oscillator according to this invention.

Figure reference numerals: 1. first comparator; 11. first current mirror unit; 12. second current mirror unit; 13. comparator signal channel; 14. third current mirror unit; 15. reverse unit; 2. second comparator; 3. SR latch; 4. capacitor control module; 41. first current mirror unit; 42. second current mirror unit; 43. oscillating unit; 431. first oscillating circuit; and 432. second oscillating circuit.

DETAILED DESCRIPTION OF THE INVENTION

The above and other technical features and advantages of this invention will be clearly and completely described combining with the accompanying drawings hereinafter. Apparently, the described embodiments are merely parts of the embodiments of this invention instead of all the embodiments.

As shown in FIG. 1, a relaxation oscillator includes a first comparator 1, a second comparator 2, an SR latch 3, and a capacitor control module 4. According to an external reference threshold voltage, a first comparison signal generated by the first comparator 1 and a second comparison signal generated by the second comparator 2 are inputted into the SR latch 3 to generate a control signal. According to a bias current of an external bias current source and the control signal outputted by the SR latch 3, periodic charging and discharging of a first capacitor C1 and a second capacitor C2 are controlled to generate oscillating signals.

The first comparator 1 includes a first input end A1, a second input end, and an output end. The first input end A1 is coupled with a first output end of the capacitor control module 4, the second input end is coupled with the external reference threshold voltage Vref, and the output end is coupled with a first input end A3 of the SR latch 3. The second comparator 2 includes a first input end A2, a second input end, and an output end. The first input end A2 is coupled with a second output end of the capacitor control module 4, the second input end is coupled with the external reference threshold voltage, and the output end is coupled with a second input end A4 of the SR latch 3. In this embodiment, input ends of the first comparator 1 and the second comparator 2 coupled with the capacitor control module 4 are positive input ends of the comparators.

Figure 2:
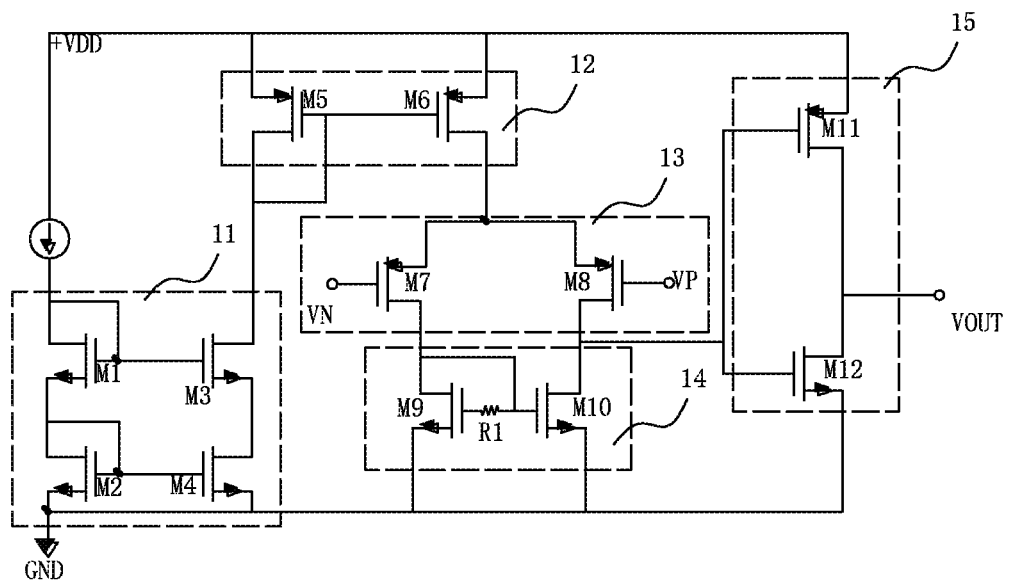
FIG. 2 is a circuit diagram of a comparator according to this invention.

As shown in FIG. 2, both the first comparator 1 and the second comparator 2 include a first current mirror unit 11, a second current mirror unit 12, a comparator signal channel 13, a third current mirror unit 14, and a reverse unit 15. The first current mirror unit 11 is coupled with the external bias current source and configured to mirror the bias current of the bias current source; the second current mirror unit 12 is coupled with the first current mirror unit 11 and configured to mirror the bias current again after the bias current is mirrored by the first current mirror unit 11; the comparator signal channel 13 is coupled with the second current mirror unit 12, the first input end of the comparator, and the second input end of the comparator, and the comparator signal channel 13 is configured to receive the bias current after the bias current is mirrored by the second current mirror unit 12, a feedback signal of the capacitor control unit, and the external reference threshold voltage and generate a comparison signal according to the bias current which has already been mirrored by the second current mirror unit 12, the feedback signal of the capacitor control unit, and the external reference threshold voltage; the third current mirror unit 14 is coupled with the comparator signal channel 13 and configured to convert the comparison signal outputted by the comparator signal channel 13 into a signal that can be inputted into the reverse unit 15 at a single-end; and the reverse unit 15 is coupled with the third current mirror unit 14 and configured to amplify the comparison signal after the comparison signal is converted by the third current mirror unit 14 and output the amplified comparison signal to the SR latch 3. In this embodiment, the first current mirror units 11 of the first comparator 1 and the second comparator 2 adopt current mirror units in a cascode structure in which M1, M2, M3, and M4 are all NMOS transistors, the second current mirror units 12 adopt basic current mirror units in which M5 and M6 are both PMOS transistors, and the third current mirror units 14 adopt active inductor current mirror units in which M9 and M10 are both NMOS transistors. The comparator signal channel 13 includes M7 and M8 which are both PMOSs, M7 in the figure corresponds to an negative input end VN of the comparator, and M8 corresponds to the positive input end VP of the comparator. The reverse unit 15 adopts PMOS transistor M11 and NMOS transistor M12 connected in parallel. The first current mirror unit 11 adopts the cascode current mirror structure, which can ensure the VDS of the MOS in the current source mirror are the same, thereby making the current replication more accurate, increasing output resistance, and improving a driving capability of the whole current mirror.

The SR latch 3 includes the first input end A3, the second input end A4, a first output end A5, and a second output end A6. The first output end A5 is coupled with a first input end of the capacitor control module 4, and the second output end A6 is coupled with a second input end of the capacitor control module 4.

The capacitor control module 4 includes the first input end, the second input end, a bias current input end, the first output end, the second output end, the first capacitor C1, and the second capacitor C2. The bias current input end is coupled with the external bias current source.

Figure 3:
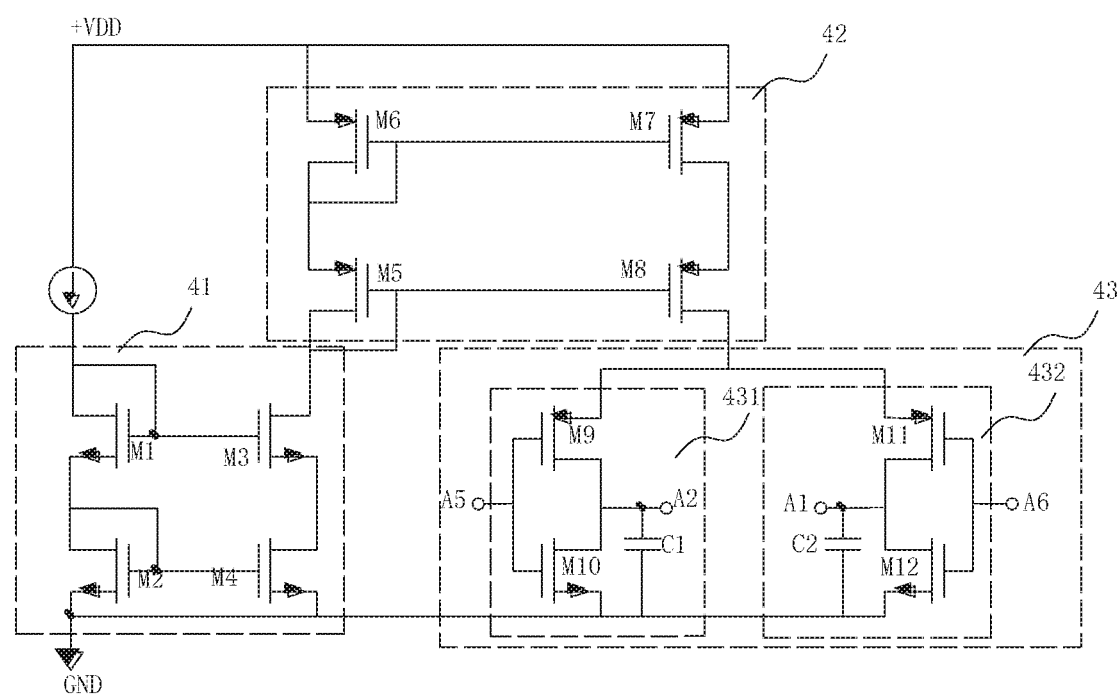
FIG. 3 is a circuit diagram of a capacitor control module according to this invention.

As shown in FIG. 3, the capacitor control module 4 includes a first current mirror unit 41, a second current mirror unit 42, and an oscillating unit 43. The first current mirror unit 41 is coupled with the bias current input end and configured to mirror the bias current of the bias current source. The second current mirror unit 42 is coupled with the first current mirror unit and configured to mirror the bias current again after the bias current is mirrored by the first current mirror unit 41. The oscillating unit 43 is coupled with the second current mirror unit 42, the first input end of the capacitor control module, the second input end of the capacitor control module, the first output end of the capacitor control module, and the second output end of the capacitor control module, and the oscillating unit 43 is configured to receive the bias current after the bias current is mirrored by the second current mirror unit 42. At the same time, through a first control signal received by the first input end, the first capacitor is controlled to periodically charge or discharge, and through a second control signal received by the second input end, the second capacitor is controlled to periodically charge or discharge. The first output end of the capacitor control module outputs oscillating signals generated by the first capacitor, and the second output end of the capacitor control module outputs oscillating signals generated by the second capacitor. A load of the current source required by the capacitor control module 4 has a certain threshold requirement, so it is necessary to replicate the current generated for charging and discharging the capacitor through the multi-stage current mirror unit.

In this embodiment, the first current mirror unit 41 of the capacitor control module 4 adopts a current mirror unit in a cascode structure consisting of NMOS transistors, and the second current mirror unit 42 adopts a current mirror unit in a cascode structure consisting of PMOS transistors.

The oscillating unit 43 includes a first oscillating circuit 431 and a second oscillating circuit 432. The first oscillating circuit 431 includes a ninth PMOS transistor, a tenth NMOS transistor, and the first capacitor. A gate of the ninth PMOS transistor is coupled with the first input end of the capacitor control module 4, a source of the ninth PMOS transistor is coupled with the second current mirror unit 42, and a drain of the ninth PMOS transistor is coupled with a drain of the tenth NMOS transistor. A gate of the tenth NMOS transistor is coupled with the first input end of the capacitor control module 4, and a source of the tenth NMOS transistor is grounded. One end of the first capacitor is coupled with a connection node of the drain of the ninth PMOS transistor and the drain of the tenth PMOS transistor, and the other end of the first capacitor is grounded. The first output end of the capacitor control module 4 is coupled with the connection node of the drain of the ninth PMOS transistor and the drain of the tenth PMOS transistor. The second oscillating circuit 432 includes an eleventh PMOS transistor, a twelfth NMOS transistor, and the second capacitor. A gate of the eleventh PMOS transistor is coupled with the second input end of the capacitor control module 4, a source of the eleventh PMOS transistor is coupled with the second current mirror unit 42, and a drain of the eleventh PMOS transistor is coupled with a drain of the twelfth NMOS transistor. A gate of the twelfth NMOS transistor is coupled with the second input end of the capacitor control module 4, and a source of the twelfth NMOS transistor is grounded. One end of the second capacitor is coupled with a connection node of the drain of the eleventh PMOS transistor and the drain of the twelfth NMOS transistor, and the other end of the second capacitor is grounded. The second output end of the capacitor control module 4 is coupled with the connection node of the drain of the eleventh PMOS transistor and the drain of the twelfth NMOS transistor.

The working principle of the capacitor control module 4 is as follows. The bias current of the external bias current source flows into M1 and M2 of the first current mirror unit 41, and M3 and M4 constituting the cascode the current mirror unit with M1 and M2 mirror the bias current inputted from the external. Since source currents and drain currents of M3 and M4 are the same as those of M5 and M6 in the second current mirror unit 42, all currents flowing through M3 and M4 are equal to the currents flowing through M5 and M6. At the same time, M5 and M6 constitute another cascode current mirror structure with M7 and M8. M7 and M8 mirror the bias current flowing through M5 and M6 so as to provide the bias current for charging and discharging the first capacitor C1 and the second capacitor C2. At this time, the bias current is consistent with the external bias current. When a signal of A5 is at a low level, M9 is turned on, and M10 is turned off, at this time, the first capacitor C1 is charged. The voltage at A2 gradually rises, and when the voltage at A2 rises above a threshold voltage (external reference threshold voltage Vref), the voltage at A4 outputted by the second comparator 2 rises from a low level to a high level instantaneously. The processes of the changes of voltage at A6, A1, and A4 are similar. A4 and A3 are the input of the SR latch 3, and when the voltage at A4 and A3 are both at a low level, there will be no state change. When the voltage at A4 is at a high level, and the voltage at A3 is at a low level, then the output at A5 is at a high level, and the output at A6 is at a low level. When the voltage at A4 is at a low level, and the voltage at A3 is at a high level, then the output at A6 is at a high level, and the output at A5 is at a low level. Therefore, when C1 is charged, the voltage at A6 must be at a high level, and M12 is turned on. At this time, charges on C2 will flow from the turned-on M12 to ground (GND) to achieve discharging. When C2 is charged, C1 is the same. Therefore, C2 and C1 will periodically charge or discharge to generate repeated oscillating signals during normal operation. The period of the oscillation frequency thereof is determined by the charging and discharging time of the capacitor, and the charging and discharging time constant of the capacitor is determined by the capacitance of the capacitor and the current charging for the capacitor. A5 and A6 are oscillating output of the latch, and the output is reversed.

In this invention, according to the external reference threshold voltage, the first comparison signal generated by the first comparator 1 and the second comparison signal generated by the second comparator 2 are inputted into the SR latch to generate the control signal. According to the bias current of the external bias current source and the control signal outputted by the SR latch, periodic charging and discharging of the first capacitor and the second capacitor are controlled to generate oscillating signals. Through structural optimization of the capacitor module, by only using a single-circuit bias current, oscillating output can be obtained; and the frequency of output signals does not change with the temperature since the current and capacitance can be independent of the temperature. Moreover, the power consumption of this relaxation oscillator circuit is reduced, the required total current is reduced, and the comparator has a relative fast speed which can quickly respond to the comparison signal beyond the threshold, such that the frequency is more accurate.

The specific embodiments described above further explain objectives, technical solutions, and beneficial effects of this invention, and it is understood that the above-mentioned description is only the embodiment of this invention and is not intended to limit the protection scope of this invention. It should be noted that for those skilled in the art, any made modifications, equivalent replacement, improvements, etc. within the spirit and principle of this invention are intended to be included in the protection scope of this invention.

What is claimed is:

1. A relaxation oscillator, comprising:
 a first comparator, comprising a first input end, a second input end, and an output end, wherein the first input end of the first comparator is coupled with a first output end of a capacitor control module, the second input end of the first comparator is coupled with an external reference threshold voltage, and the output end of the first comparator is coupled with a first input end of an SR latch;
 a second comparator, comprising a first input end, a second input end, and an output end, wherein the first input end of the second comparator is coupled with a second output end of the capacitor control module, the second input end of the second comparator is coupled with the external reference threshold voltage, and the output end of the second comparator is coupled with a second input end of the SR latch;
 the SR latch, comprising the first input end, the second input end, a first output end, and a second output end, wherein the first output end of the SR latch is coupled with a first input end of the capacitor control module, and the second output end of the SR latch is coupled with a second input end of the capacitor control module; and
 the capacitor control module, comprising the first input end, the second input end, a bias current input end, the first output end, the second output end, a first capacitor, and a second capacitor, wherein the bias current input end of the capacitor control module is coupled with an external bias current source;
 wherein according to the external reference threshold voltage, a first comparison signal generated by the first comparator and a second comparison signal generated by the second comparator are inputted into the SR latch to generate a control signal, and according to a bias current of the external bias current source and the control signal outputted by the SR latch, periodic charging and discharging of the first capacitor and the second capacitor are controlled to generate an oscillating signal, wherein both the first comparator and the second comparator comprising:
 a first current mirror unit, coupled with the external bias current source and configured to mirror the bias current of a bias current source;
 a second current mirror unit, coupled with the first current mirror unit and configured to mirror the bias current again after the bias current is mirrored by the first current mirror unit
 a comparator signal channel coupled with the second current mirror unit, the first input end of the comparator, and the second input end of the comparator, and the comparator signal channel configured to receive the bias current after the bias current is mirrored by the second current mirror unit, a feedback signal of the capacitor control unit, and the external reference threshold voltage and generate a comparison signal according to the bias current which has already been mirrored by the second current mirror unit, the feedback signal of the capacitor control unit, and the external reference threshold voltage;
 a third current mirror unit, coupled with the comparator signal channel and configured to convert the comparison signal outputted by the comparator signal channel into a signal capable of being inputted into a reverse unit at a single-end; and
 the reverse unit, coupled with the third current mirror unit and configured to amplify the comparison signal after the comparison signal is converted by the third current mirror unit and output the amplified comparison signal to the SR latch.

2. The relaxation oscillator according to claim 1, the capacitor control module comprising:
 the first current mirror unit, coupled with the bias current input end and configured to mirror the bias current of the bias current source;
 the second current mirror unit, coupled with the first current mirror unit and configured to mirror the bias current again after the bias current is mirrored by the first current mirror unit; and an oscillating unit, coupled with an output end of the second current mirror unit, the first input end of the capacitor control module, the second input end of the capacitor control module, the first output end of the capacitor control module, and the second output end of the capacitor control module, and the oscillating unit configured to receive the bias current after the bias current is mirrored by the second current mirror unit, wherein at the same time, the first capacitor is controlled to periodically charge or discharge through a first control signal received by the first input end of the capacitor control module, the second capacitor is controlled to periodically charge or discharge through a second control signal received by the second input end of the capacitor control module, the first output end of the capacitor control module outputs the oscillating signal generated by the first capacitor, and the second output end of the capacitor control module outputs the oscillating signal generated by the second capacitor.

3. The relaxation oscillator according to claim 2, wherein the first current mirror unit adopts a current mirror unit in a cascode structure consisting of n-channel metal oxide semiconductor transistors.

4. The relaxation oscillator according to claim 2, wherein the second current mirror unit adopts a current mirror unit in a cascode structure consisting of positive channel metal oxide semiconductor (PMOS) transistors.

5. The relaxation oscillator according to claim 2, the oscillating unit comprising:
a first oscillating circuit comprising a ninth PMOS transistor, a tenth NMOS transistor, and the first capacitor, wherein a gate of the ninth PMOS transistor is coupled with a first input end of the oscillating unit, a source of the ninth PMOS transistor is coupled with the output end of the second current mirror unit, a drain of the ninth PMOS transistor is coupled with a drain of the tenth NMOS transistor, a gate of the tenth NMOS transistor is coupled with the first input end of the oscillating unit, a source of the tenth NMOS transistor is grounded, one end of the first capacitor is coupled with a connection node of the drain of the ninth PMOS transistor and the drain of the tenth NMOS transistor, the other end of the first capacitor is grounded, and the first output end of the capacitor control module is coupled with the connection node of the drain of the ninth PMOS transistor and the drain of the tenth NMOS transistor; and
a second oscillating circuit comprising an eleventh PMOS transistor, a twelfth NMOS transistor, and the second capacitor, wherein a gate of the eleventh PMOS transistor is coupled with a second input end of the oscillating unit, a source of the eleventh PMOS transistor is coupled with the output end of the second current mirror unit, a drain of the eleventh PMOS transistor is coupled with a drain of the twelfth NMOS transistor, a gate of the twelfth NMOS transistor is coupled with the second input end of the oscillating unit, a source of the twelfth NMOS transistor is grounded, one end of the second capacitor is coupled with a connection node of the drain of the eleventh PMOS transistor and the drain of the twelfth NMOS transistor, the other end of the second capacitor is grounded, and the second output end is coupled with the connection node of the drain of the eleventh PMOS transistor and the drain of the twelfth NMOS transistor.

6. The relaxation oscillator according to claim 1, wherein the first current mirror unit adopts a current mirror unit in a cascode structure consisting of NMOS transistors.

7. The relaxation oscillator according to claim 1, wherein the third current mirror unit adopts an active inductor current mirror unit.

* * * * *